United States Patent [19]

Hayashi et al.

[11] Patent Number: 5,238,705
[45] Date of Patent: Aug. 24, 1993

[54] CARBONACEOUS PROTECTIVE FILMS AND METHOD OF DEPOSITING THE SAME

[75] Inventors: Shigenori Hayashi; Toshiji Hamatani, both of Atsugi; Shunpei Yamazaki, Tokyo, all of Japan

[73] Assignee: Semiconductor Energy Laboratory Co., Ltd., Kanagawa, Japan

[21] Appl. No.: 380,328

[22] Filed: Jul. 17, 1989

Related U.S. Application Data

[63] Continuation-in-part of Ser. No. 159,610, Feb. 24, 1988, Pat. No. 4,869,923.

[30] Foreign Application Priority Data

Jul. 17, 1988 [JP] Japan ................ 63-177849
Jul. 17, 1988 [JP] Japan ................ 63-177850

[51] Int. Cl.$^5$ .............................................. C23C 16/00
[52] U.S. Cl. .................................. 427/122; 427/249
[58] Field of Search ............................... 427/122, 249

[56] References Cited

U.S. PATENT DOCUMENTS

| | | | |
|---|---|---|---|
| 3,321,327 | 5/1967 | Blanchard | 427/249 |
| 3,549,847 | 12/1970 | Clark | 427/249 |
| 3,607,541 | 9/1971 | Tombred | 427/249 |
| 3,949,106 | 4/1976 | Araki | 427/249 |
| 4,060,660 | 11/1977 | Carlson | 427/122 |
| 4,434,188 | 2/1984 | Kamo | 427/122 |
| 4,492,652 | 1/1985 | Kaplan | 427/122 |
| 4,504,519 | 3/1985 | Zelez | 427/249 |
| 4,645,713 | 2/1987 | Shioya | 427/122 |
| 4,668,579 | 5/1987 | Strangman | 427/249 |
| 4,701,317 | 10/1987 | Arakawa | 427/249 |
| 4,869,923 | 1/1989 | Yamazaki | 427/122 |
| 4,871,581 | 10/1989 | Yamazaki | 427/122 |

FOREIGN PATENT DOCUMENTS

| | | | |
|---|---|---|---|
| 304220 | 2/1989 | European Pat. Off. | 427/249 |
| 244149 | 3/1987 | Fed. Rep. of Germany | 427/249 |
| 65796 | 4/1985 | Japan | 427/249 |
| 1097194 | 5/1986 | Japan | 427/249 |
| 2167885 | 7/1987 | Japan | 427/249 |
| 3169380 | 7/1988 | Japan | 427/249 |

OTHER PUBLICATIONS

L. Mackenzie Miall, "A New Dictionary of Chemistry", Interscience Publishers, Inc., 1961, p. 379.

*Primary Examiner*—Shrive Beck
*Assistant Examiner*—Vi Duong Dang
*Attorney, Agent, or Firm*—Sixbey, Friedman, Leedom & Ferguson

[57] ABSTRACT

Diamond films are formed by chemical vapor reation. Nitrogen or halogen compound gas is inputted to the reaction chamber together with a reactive gas of hydrocarbon. The resistivity, transparency and hardness of the deposited films can be controlled by adjusting the introduction rate of the halogen or nitrogen.

9 Claims, 8 Drawing Sheets

CARBONACEOUS PROTECTIVE FILMS AND METHOD OF DEPOSITING THE SAME

RELATED APPLICATION

This application is a continuation-in-part of application Ser. No. 159,610 filed Feb. 24, 1988, now U.S. Pat. No. 4,869,923.

BACKGROUND OF THE INVENTION

This invention concerns improvements relating to the deposition of thin carboneous films.

Carbon thin films are very suitable for making surfaces abrasion-proof, smooth, or highly thermal conductive. Such a carbon film is deposited by use of chemical vapour reaction. A plasma state is developed in a reactive gas by applying high frequency electric energy between a pair of electrodes defining therebetween the deposition region, and by using a hydrocarbon gas and a carrier of hydrogen as the reactive gas a carbon film can be deposited on a surface. During the deposition process, positive ions, such as hydrogen ions, are impelled towards the surface to be coated by the voltage between the pair of electrodes and sputter the depositing film. This sputtering functions to reduce the formation of carbon bonds based on the sp and $sp^2$ orbitals and to increase the proportion of carbon bonds based on the $sp^3$ orbital, and as a result the carbon film tends to grow with a diamond structure.

Such prior art carbon films, however, have relatively high resistivities and therefore tend to collect on their surface electric charge which in turn attracts dusts. In case of the application of static electricity, charge is accumulated and undesirably kept on a protective film made of such a carbon film and as a result expected characteristics can not be maintained for a long use. The introduction of a conductive agent into the carbon film may resolve the problem. However, the conductive agent in turn creates absorption centers which place limitation to the application thereof.

On the other hand, such carbon films tend to be formed accumulating inner strain therein during the fabrication process. The inner strain sometimes causes peeling-off of the carbon film from the underlying surface. The problem seems to be solved by making thinner the films or providing an intermediate film between the carbon film and the underlying surface. However, the strength of such a thin film is not sufficient and the provision of such an intermediate film rises the production cost.

SUMMARY OF THE INVENTION

It is therefore an object of the invention to provide an excellent method of forming carbon materials having an appropriate degree of conductivity and a hard external surface.

In order to accomplish the above and other objects the present invention proposes that carbon deposition on a substrate is carried out with doping of nitrogen or a halogen. The conductivity, the transparency and the hardness of the carbon film deposited can be controlled by adjusting the introduction of nitrogen or a halogen. The introduction is carried out by inputting, together with a carbon source gas, for example, $NH_3$, $NF_3$, $SF_6$, $WF_6$, $CCl_4$, $CH_3Br$, F, ClBr or I.

DETAILED DESCRIPTION OF THE PREFERRED EMBODIMENTS

Figure 5:
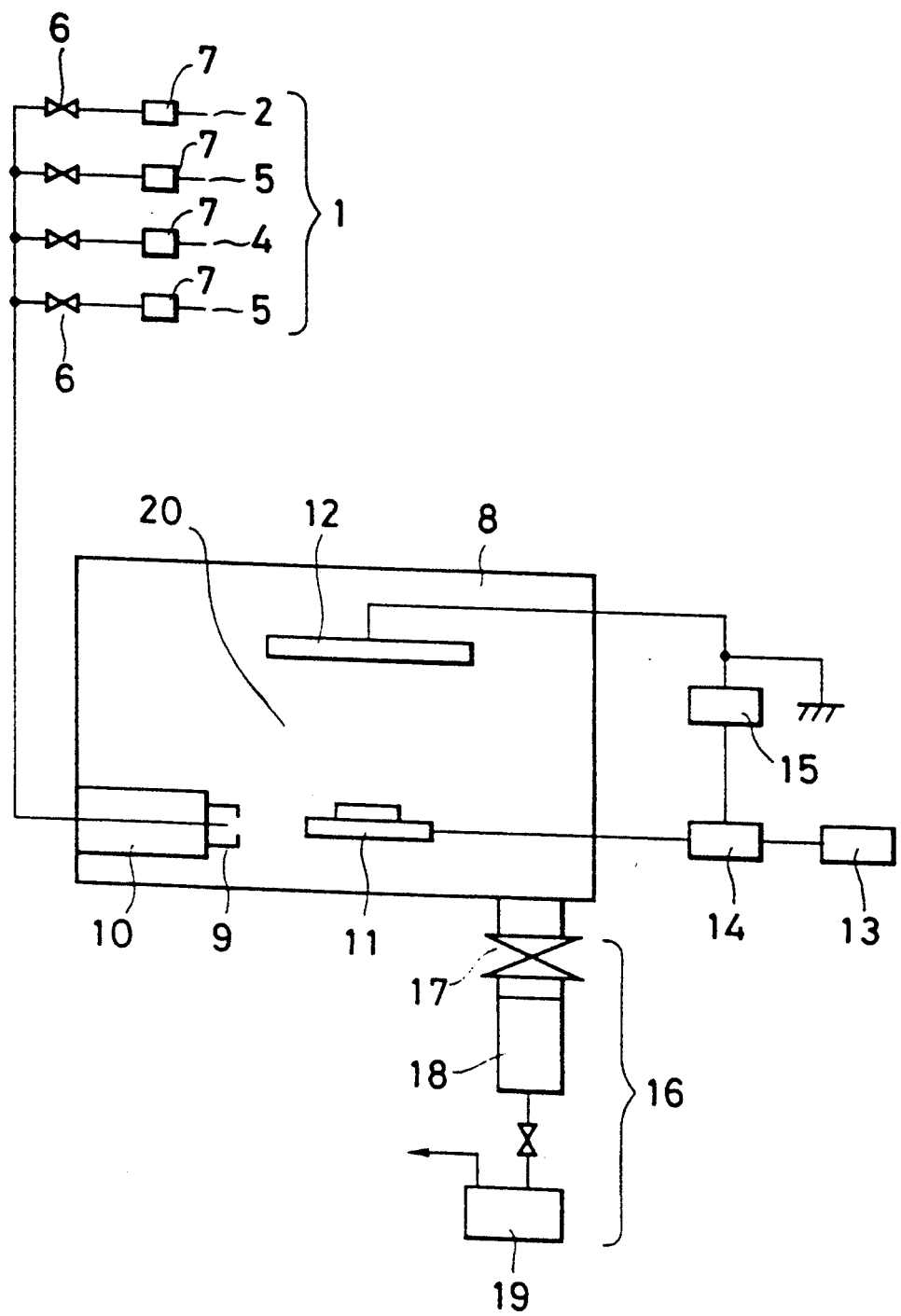
FIG. 5 is a schematic diagram showing a CVD apparatus for carbon deposition in accordance with the present invention.
Figure 6:
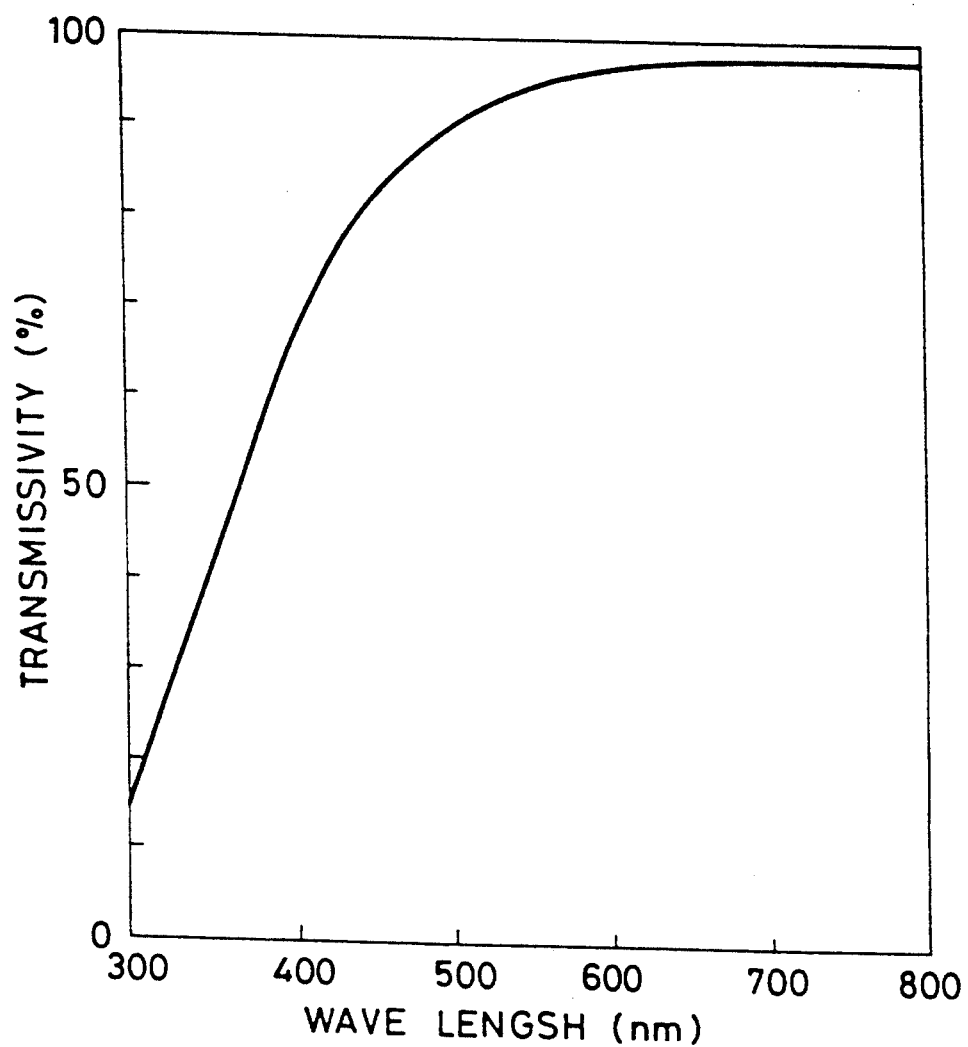
FIG. 6 is a graphical diagram showing the transmissivity of a carbon film deposited in accordance with the present invention with reference to the wavelength of light.

Referring to FIG. 5, there is schematically shown therein a plasma CVD apparatus for deposition carbon material on a surface in accordance with the teaching of the present invention. The surface to be coated may for example be made of semiconductor material, glass, metal, ceramics, organic resins, magnetic substance and so forth.

The apparatus comprises a reaction chamber 8 defining a reaction space 20 therein, first and second electrodes 11 and 12, a high frequency electric power source 13 for supplying electric energy through a matching transformer 14, a DC bias source 15 connected in series between the electrodes 11 and 12, a gas supply system 1 consisting of four gas supply passages each of which is provided with a flow meter 7 and a valve 6, a microwave energy supply 10 for exciting gasses from the supply system 1 by injection of microwave energy, a nozzle 9 through which gas excited by the microwave energy supply 10 is introduced into the reaction space 20, and an exhaust system 16 including a pressure control valve 17, a turbomolecular pump 18 and a rotary pump 19. The electrodes are designed such that (the area of the first electrode 11)/(the area of the second electrode 12)<1.

In operation of this apparatus, a carrier gas of hydrogen is introduced to the reaction space 20 from the gas supply passage 2 together with a reactive gas comprising a hydrocarbon such as methane or ethylene supplied from the gas supply passage 3. The gas introduction rates of the hydrogen and the hydrocarbon gas are equal. In addition, a halogen source gas comprising a halogen or a nitrogen source gas comprising nitrogen is inputted to the reaction space 20 through the gas supply passage 4 or 5 in order to introduce the halogen atoms into carbon material deposited. Pre-excitation may be effected by the microwave energy supply 10. The pressure in the reaction space is maintained within the range between 0.001 to 10 Torr, preferably 0.01 to 0.5 Torr, e.g. 0.015 Torr. High frequency electric energy at a frequency not lower than 1 GHz, preferably 2.45 GHz, is applied to the reactive gas at a power level of from 0.1 to 5 kilo Watt for breaking C—H bonds. When the frequency is selected to be from 0.1 to 50 MHz, C=C bonds can be broken and transformed to —C—C— bonds. By virtue of this reaction, carbon atoms are deposited in the form of a structure in which the diamond structure occurs at least locally.

A bias voltage of, for example, −200 to 600 V is set at the DC bias source 15. The effective bias voltage level is substantially −400 to +400 V in virtue of the fact that a self bias level of −200 V is spontaneously applied between the electrodes 11 and 12 with the bias voltage level of the source 15 being zero.

Generally, the high frequency input power is chosen to be between 10 Watts and 5 kilo-Watt, preferably between 50 Watts and 1 kilo-Watt, e.g. 60 W. This input power corresponds to 0.03 to 3 Watt/cm$^2$ in terms of plasma energy.

In accordance with experiments, the carbon films deposited had a good transparency. As seen from the FIG. 2, 95% of higher transmissivity can be expected at wavelengths of 400 nm or longer, and 50% or higher transmissivity can be expected at wavelengths of 600 nm or longer. The inner strain in the carbon films was measured to be more than 10$^7$ dyn/cm$^2$. No deterioration on the surfaces of the carbon films was confirmed by an optical microscope with a magnification of 400 even after the films were subjected to acids, alkalis or corrosive organic solutions or even after the films were kept in an incubator at 500 in air.

Figure 1:
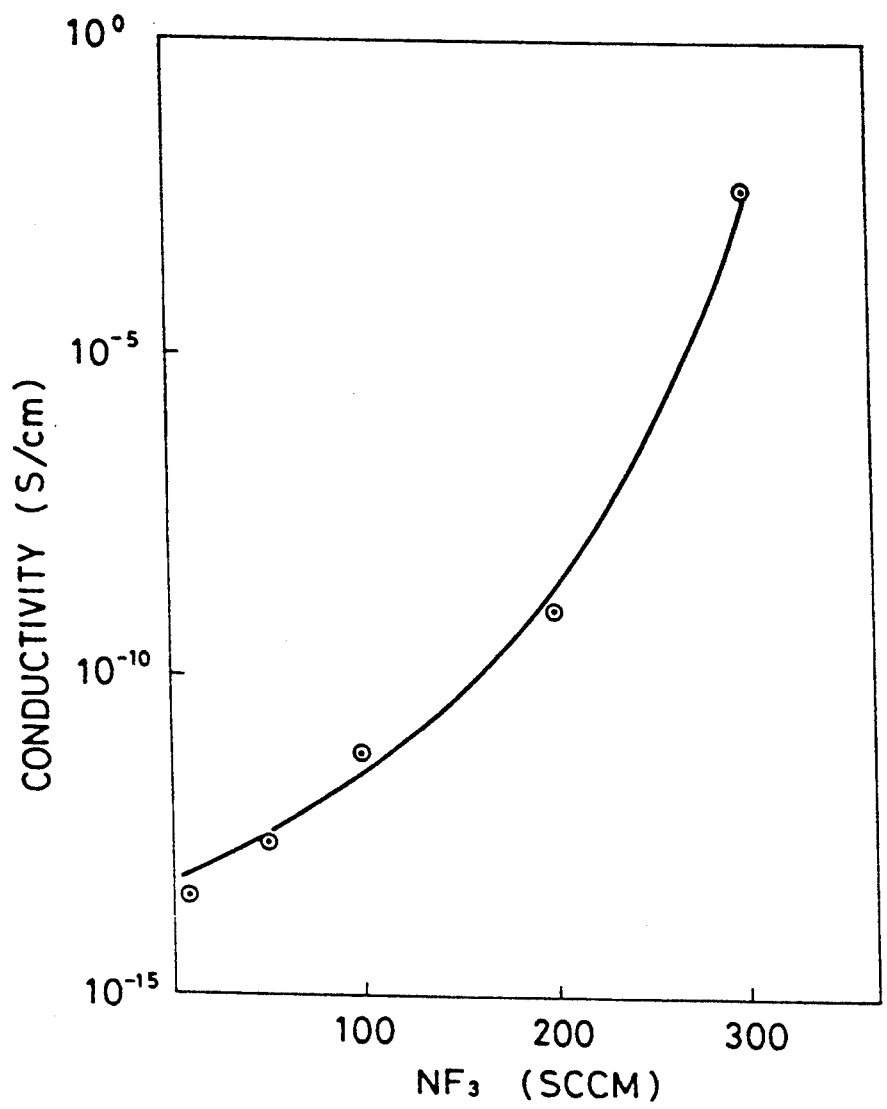
FIGS. 1, 2 and 3 are graphical diagrams showing the relationships between the flow rate of $NF_3$ and the properties of deposited films in accordance with the present invention. p
Figure 2:
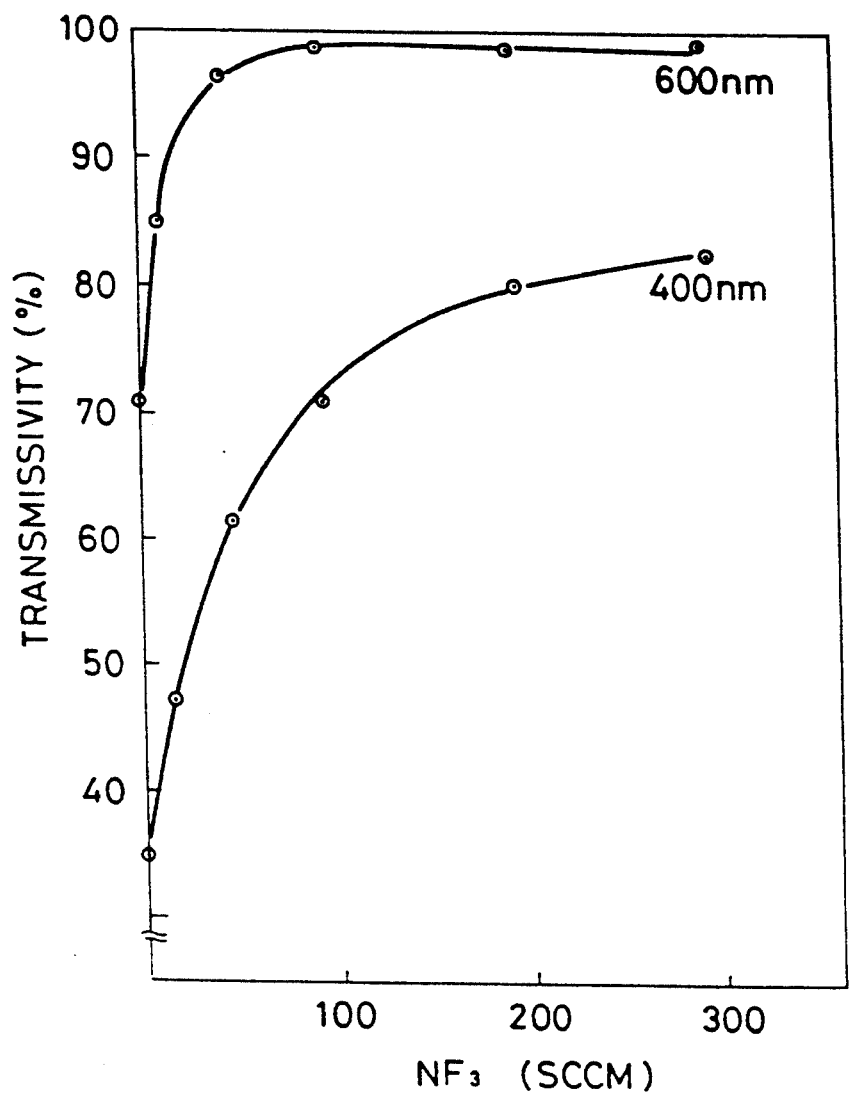
Figure 3:
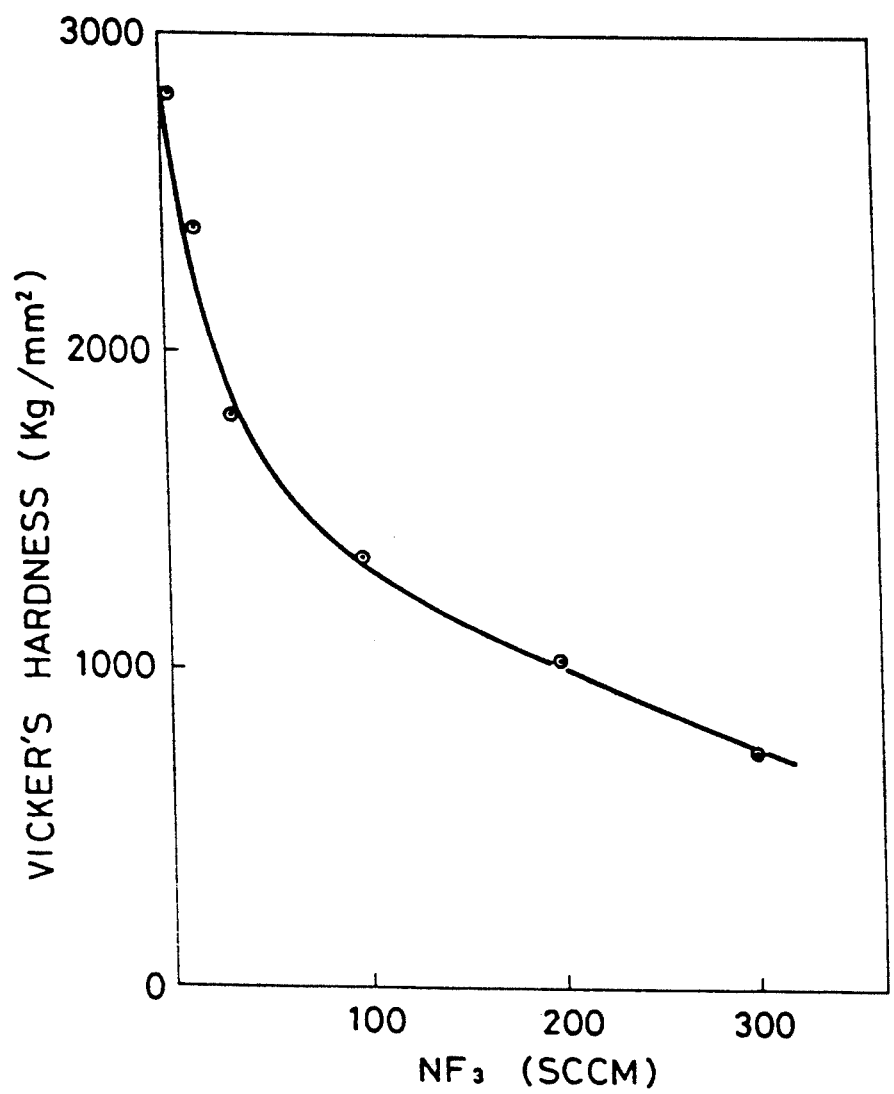
Figure 4:
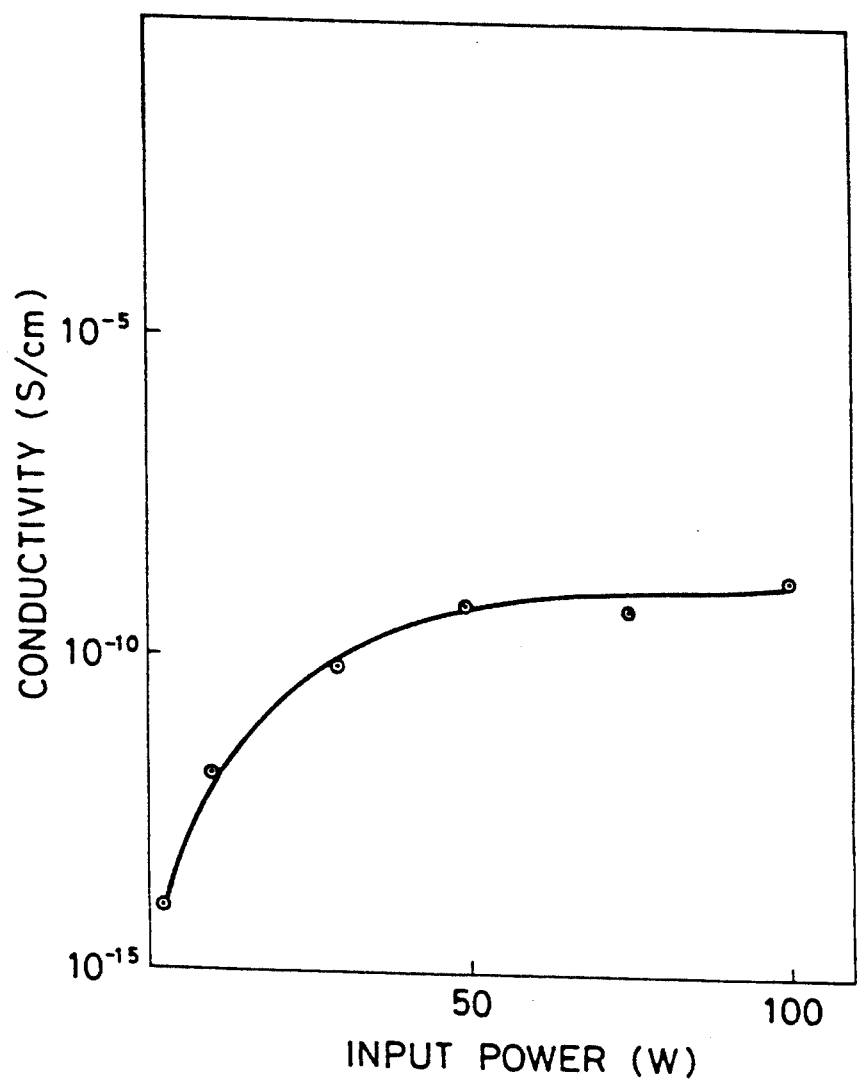
FIG. 4 is a graph illustrating the relationship between electrical conductivity and input conductivity with respect to a deposited film in accordance with the invention.

Carbon films were deposited in accordance with the above procedure by the use of varying amounts of NF$_3$ as the halogen compound gas. The hydrocarbon gas was C$^2$H$^2$ introduced at 10 SCCM into the deposition region. The reaction pressure and input power energy density were 10 Pa and 0.08 W/cm$^2$. FIG. 2 shows the relationship between the flow rate of NF$_3$ and the conductivity of the films. As can be seen from the figure, the conductivity increased together with the flow rate. FIG. 3 shows the relationship between the flow rate of NF$_3$ and the transmissivity of the films with respect to light rays of 400 nm wavelength and 600 nm wavelength. As can be seen from the figure, the transmissivity increased with the flow rate. FIG. 4 shows the relationship between the flow rate of NF$_2$ and the Vickers hardness of the films. As can be seen from the figure, the conductivity increased as the flow rate decreased.

FIG. 4 is a graphical representation showing the relationship between the input power energy level and the conductivity of the deposited films. The conductivity increased together with the input power level. It can be interpretted that the variation of the input power causes the variation of the proportion of fluorine contained in the films.

The relationships as shown in FIGS. 1 to 4 were confirmed also in case of the use of a nitrogen source gas instead of the halogen source gas such as ammonia.

Several exemplary processes for the deposition of carbon thin films in accordance with the present invention will now be described.

EXAMPLE 1

Carbon protective coatings was deposited on a wire bonding structure connecting an IC chip and a lead frame. In accordance with the present invention, it was possible to circumvent separation of the gold wirings from the Al contacts of the IC chip due to latent strain, which may otherwise exist in the protective coatings.

C$_2$H$_4$ and NF$_3$ were introduced at the same flow rate into the deposition chamber and underwent the chemical vapor reaction according to the above procedure in order to form a 0.6 micrometer thick carbon film having its inner strain of 10$^7$ dyn/cm$^2$ on the bonding structure. Next, the flow rate of NF$_3$ was decreased to 1/100 of that of C$_2$H$_4$. As a result, there is deposited an external carbon film of 0.1 micrometer thickness having a Vickers hardness of no lower than 2000 Kg/mm$^2$. The density of the fluorine atoms was measured to be 0.5% in the lower carbon film but the density in the upper carbon film was not applicable. The carbon protective coating serves to block the entrance of water or alkali ions and eventually improves the reliability of the IC.

EXAMPLE 2

Figure 7:
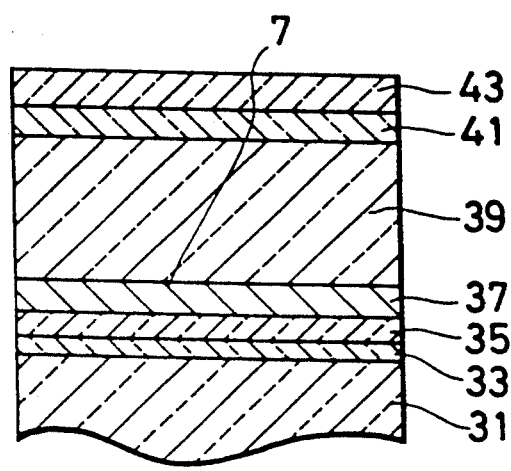
FIG. 7 is a cross sectional view showing a photosensor manufactured in accordance with the present invention.

Referring to FIG. 7, the structure of a photosensor for use in a copying machine is illustrated. The photosensor comprises a PET (Polyethylene terephtalate) sheet 31 of 200 micrometers thickness, an Al film 33 deposited on the sheet 31 to a thickness of 600 Å by evaporation, an intermediate film 35 made of an organic resin, a photosensitive film 37 which generates electron-hole pairs in response to light incidence, a carrier transfer layer 39 made of an organic resin which allow carrier transmission therethrough. The photosensitive film 37 may be formed of any photosensitive material such as organic photoconductive materials, amorphous silicon semiconductors and selenious photoconductors. The external surface of the carrier transfer layer 39 was coated with a protective film made of an upper and lower carbon films 41 and 43 deposited in accordance with the present invention. The carbon deposition was first performed by adjusting the flow rate of NF$_3$ at 0.1 SCCM for 2 minutes and the flow rate of C$_2$H$_2$ at 100 SCCM in order to form the lower carbon film 41 of 0.02 micrometer thickness and then continued both at 100 SCCM in order to form the upper carbon film 43 of one micron thickness. The density of fluorine was measured to be about 0.5 mol % in the film 43 but that in the film 41 was too small to be measured. The resistivity of the dual carbon film was measured to be 10$^{11}$ to 10$^9$ ohm centimeters, which is sufficiently high as to inhibit substantial lateral current flow but not so high as to accumulate substantial charge thereon. The resistivity, transparency, hardness, inner strain of the dual carbon film structure are determined substantially by the properties of the upper film 43 because the thickness thereof is considerably greater than that of the lower film 41. On the other hand, the mechanical connection of the dual film depends only on the property of the lower film 41. In this example, since the introduction of a halogen deteriorates the adhesivity of carbon films, the initial carbon deposition was performed without much introduction of a halogen. Of course, in case that no particular attention is needed to the mechanical connection between the carbon protective film and the underlying surface, the carbon deposition can be carried out at a constant halogen introduction.

Alternatively, a third thin carbon film of 0.02 micrometers with little introduction of halogen may be coated on the second carbon film in order to provide a surface having a high hardness. In this case, since the inner strain is determined by the second thick film, there occurs no cracks and no peeling even if the photosensitive sheet is bent at 10 mm of the radius of curvature.

EXAMPLE 3

Figure 8:
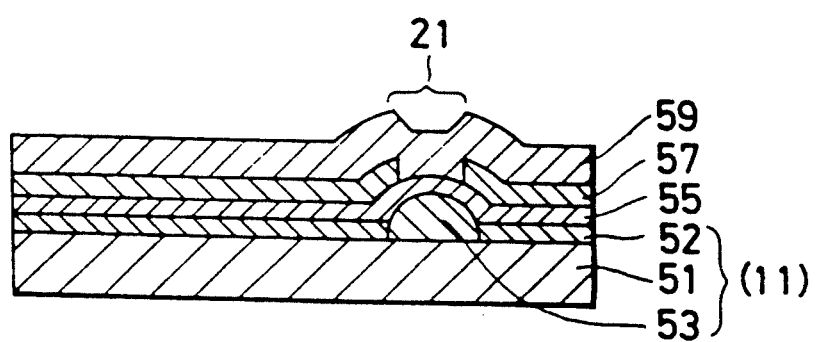
FIG. 8 is a cross sectional view showing a thermal head manufactured in accordance with the present invention.

FIG. 8 illustrates the structure of a representative thermal printer. The structure comprises an insulating substrate 51, a grazing film 52 of $SiO_2$, a swelling glaze 53, a heating film 55 and a conductive film 57. A window was opened by a known photolithography in the conductive film 57 just above the graze 53. A protective carbon coating 59 was deposited on the outer surface of the structure in accordance with the present invention. As a result, a heating region 2 was formed just above the window.

Conventionally, the protective film has been made from silicon nitrogen which has to be deposited to a thickness of 5 micrometers of thereabout. In case of the present invention, since the strain of the film is very small, e.g. $10^9$ dyn/$cm^2$, the thickness can be reduced to about one micrometer. In accordance with experiments, the carbon films were not degraded after keeping it at 500° C. for an hour.

The carbon film can be utilized also to form a heating film when the resistivity of the film is adjusted between $10^3$ ohm centimeter and $10^4$ ohm centimeter by controlling the introduction ratio of halogen.

EXAMPLE 4

Figure 9:
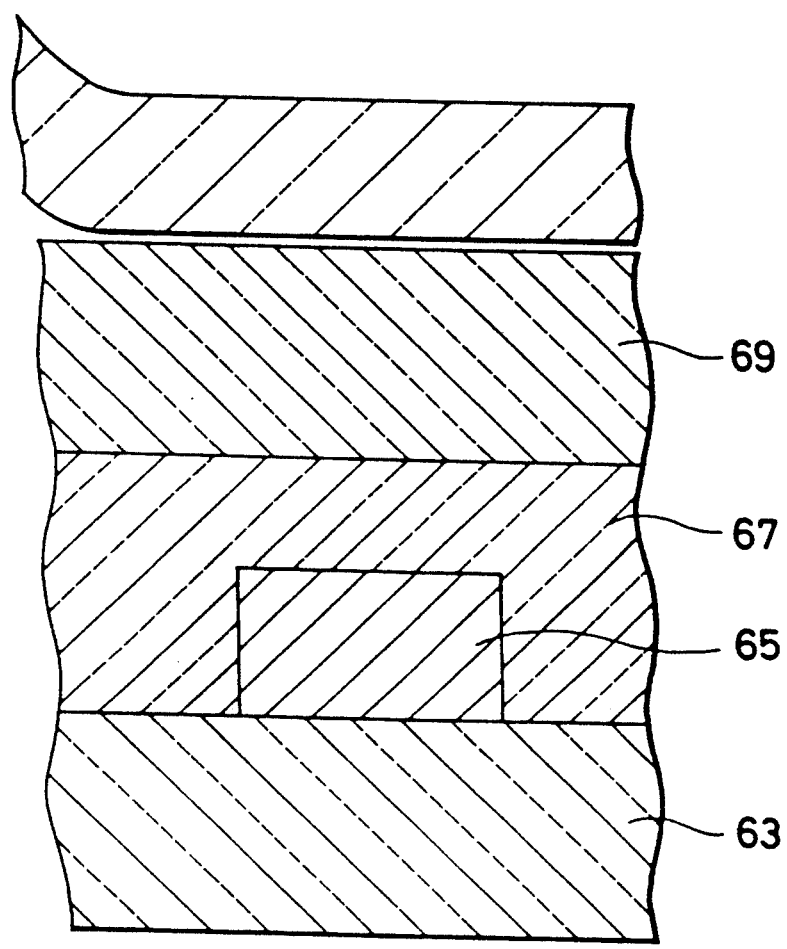
FIG. 9 is a cross sectional view showing an image sensor manufactured in accordance with the present invention.

FIG. 9 is partial view showing an image sensor. The s comprises a transparent glass substrate 63, a photosensor 65 formed on the substrate 63, a polyimide film 67 formed on the substrate 63 over the photosensor 65. The external surface of the polyimide film was coated with a carbon film 69 in accordance with the present invention.

The thickness of the carbon film 69 was 2.0 micrometers. The Vickers hardness of the film was measured to be 2500 Kg/$cm^2$. The resistivity was measured to be $1 \times 10^5$ ohm centimeter.

When a carbocyclic compound was used as the reactive gas, the carbon deposition speed was significantly increased. This is thought because the double bonds were rendered combined with each other by virtue of the plasma reaction into single bonds which constitute diamond structure. The following table contains the examples of such a carbon compounds. In these compounds, if poisonous property is undesirable, toluene or xylene are preferred than benzene which is a carcinogen. The deposition speed was particularly increased when the carbocyclic compound comprises fluorine.

TABLE

Examples of carbocyclic compounds

| | Structural Formula | Rational Formula | B.P. (°C.) | M.P. (°C.) | M.W. |
|---|---|---|---|---|---|
| Benzene | | $C_6H_6$ | 80.1 | 5.4–5.5 | 78.1 |
| Cyclopentadiene | | $C_5H_6$ | 38–39 | −85 | 66.1 |
| Cyclohexadiene | | $C_6H_8$ | 80–88 | −89 to −49 | 80.13 |
| Fulvene | | $C_5H_4CH_2$ | | | 78.1 |
| Toluene | | $C_6H_5CH_3$ | 110.6–95.0 | 92.14 | 92.1 |
| Xylene | | $C_6H_4(CH_3)_2$ | 138–144 | −25–13 | 106.2 |
| Styrene | | $C_6H_5CHCH_2$ | 145.2 | −30.69 | 104.2 |
| Thiophene | | $C_4H_4S$ | 82 | −38.3 | 84.14 |

TABLE-continued

Examples of carbocyclic compounds

| | Structural Formula | Rational Formula | B.P. (°C.) | M.P. (°C.) | M.W. |
|---|---|---|---|---|---|
| Pyrrole | (structure) | $C_4H_4NH$ | 130 | | 67.09 |
| Pyrane | (structure) | $C_5H_6O$ | | | 82.1 |
| Hydroquinone | (structure) | $C_6H_4(OH)_2$ | 285 | 73–175 | 110.1 |
| Monoflorobenzene | (structure) | $C_6H_5F$ | | | 96.1 |
| Diflorobenzene | (structure) | $C_6H_4F_2$ | | | 114.1 |
| Monoflorotoluene | (structure) | $C_6H_4FCH_3$ | | | 110.1 |

In advance of the deposition, plasma cleaning is effective to improve the adhesivity. Experiments of carbon deposition were made by employing the cleaning with a hydrogen plasma. The plasma conditions for cleaning were as follows; the plasma pressure was 0.05 Torr; the input power was 20 W; the introduction rate of hydrogen was 200 SCCM. The carbon deposition was successively carried out as described above with a reactive gas of $C_2H_2/C_2F_6$. The effect of the cleaning was adjusted by changing the bias level and the cleaning time. Few peeling was observed when the plasma cleaning was effected to an organic photoconductive film as the underlying film of the carbon film, while there were observed a number of peelings in case without the cleaning. If the plasma cleaning was effected with a bias voltage of +190 V for 90 sec, the peeling came to take place again since the underlying organic surface was damaged by the strong plasma bombardment.

While a description has been made for several embodiments, the present invention should be limited only by the appended claims and should not be limited by the particular examples, and there may be caused to artisan some modifications and variation according to the invention. For example, it has been proved effective to add boron, phosphorus or the like into the carbon coating. Preferably, the proportion of hydrogen or a halogen is preferably not higher than 25 atomic % and the proportion of the other additives are not higher than 5%. Also, through the experiments were carried out for depositing carbon coatings on semiconductor substrates, the carbon coatings can be deposited on a substrate made of an organic resin such as PET (polyethyleneterephthlate), PES, PMMA, teflon, epoxy and polyimides, metalic meshs, papers, glass, metals, ceramics and others.

The types of carbon coatings deposited in accordance with the present invention includes amorphous, polycrystals (comprising diamond powders), diamond films. In the case of a dual film, lower and upper films may be, respectively, amorphous and amorphous (having different hardnesses), amorphous and polycrystals, polycrystals and polycrystals, or polycrystals and a diamond film.

We claim:

1. A method of forming a carbonaceous protective film on an electric device comprising:
    placing said electric device in a reaction chamber;
    inputting a carbon compound gas and an additive compound gas comprising $NF_3$;
    inputting electrical energy to said gases in order to decompose said gases and carry out plasma deposition of said carbonaceous protective film on said electric device; and
    adjusting the amount of at least said additive gas with respect to the carbon compound gas to adjust the electrical conductivity of said carbonaceous protective film.

2. The method of claim 1 wherein said carbon compound gas is a hydrocarbon.

3. The method of claim 1 where the amount of the additive gas with respect to the carbon compound gas is adjusted by adjusting the flow rate of the additive gas.

4. A method of forming a carbonaceous protective film on an electric device comprising:
   placing said electric device in a reaction chamber;
   inputting a carbon compound gas and an additive compound gas comprising $NF_3$;
   inputting electrical energy to said gases in order to decompose said gases and carry out plasma deposition of said carbonaceous protective film on said electric device; and
   adjusting the amount of at least said additive gas with respect to the carbon compound gas to adjust the light transmissivity of said carbonaceous protective film.

5. The method of claim 4 wherein said carbon compound gas is a hydrocarbon.

6. The method of claim 4 where the amount of the additive gas with respect to the carbon compound gas is adjusted by adjusting the flow rate of the additive gas.

7. A method of forming a carbonaceous protective film on an electric device comprising:
   placing said elective device in a reaction chamber;
   inputting a carbon compound gas and an additive compound gas comprising $NF_3$;
   inputting electrical energy to said gases in order to decompose said gases and carry out plasma deposition of said carbonaceous protective film on said electric device; and
   adjusting the amount of at least said additive gas with respect to the carbon compound gas to adjust the hardness of said carbonaceous protective film.

8. The method of claim 7 wherein said carbon compound gas is a hydrocarbon.

9. The method of claim 7 where the amount of additive gas with respect to the carbon compound gas is adjusted by adjusting the flow rate of the additive gas.

* * * * *